United States Patent
Huang et al.

(10) Patent No.: US 10,008,492 B2
(45) Date of Patent: Jun. 26, 2018

(54) ELECTROSTATIC DISCHARGE (ESD) PROTECTION DEVICE AND METHOD FABRICATING THE ESD PROTECTION DEVICE

(71) Applicant: United Microelectronics Corp., Hsinchu (TW)

(72) Inventors: Chung-Yu Huang, Tainan (TW); Ping-Chen Chang, Pingtung County (TW); Hou-Jen Chiu, Taichung (TW)

(73) Assignee: United Microelectronics Corp., Hsinchu (TW)

( * ) Notice: Subject to any disclaimer, the term of this patent is extended or adjusted under 35 U.S.C. 154(b) by 7 days.

(21) Appl. No.: 15/353,348

(22) Filed: Nov. 16, 2016

(65) Prior Publication Data

US 2018/0138167 A1    May 17, 2018

(51) Int. Cl.
*H01L 29/06* (2006.01)
*H01L 27/02* (2006.01)
*H01L 29/08* (2006.01)
*H01L 29/10* (2006.01)
*H01L 29/66* (2006.01)

(52) U.S. Cl.
CPC ...... *H01L 27/0285* (2013.01); *H01L 29/0649* (2013.01); *H01L 29/0847* (2013.01); *H01L 29/1083* (2013.01); *H01L 29/66575* (2013.01)

(58) Field of Classification Search
CPC ......... H01L 29/06; H01L 29/08; H01L 29/10; H01L 29/66; H01L 27/02; H01L 27/028; H01L 27/0285; H01L 29/064; H01L 29/0649; H01L 29/084; H01L 29/0847; H01L 29/108; H01L 29/1083; H01L 29/665; H01L 29/6657; H01L 29/66575
USPC ......................................................... 257/355
See application file for complete search history.

(56) References Cited

U.S. PATENT DOCUMENTS

| | | | |
|---|---|---|---|
| 7,180,133 B1 | 2/2007 | Vashchenko et al. | |
| 7,655,980 B1 | 2/2010 | Chao et al. | |
| 8,530,969 B2 | 9/2013 | Chen et al. | |
| 2011/0237041 A1* | 9/2011 | Chu | H01L 29/0847 438/307 |
| 2012/0161236 A1* | 6/2012 | Huang | H01L 27/0277 257/355 |
| 2016/0049464 A1* | 2/2016 | Lin | H01L 29/66636 257/192 |

\* cited by examiner

*Primary Examiner* — Monica D Harrison
(74) *Attorney, Agent, or Firm* — J.C. Patents (57) ABSTRACT

An electrostatic discharge (ESD) device includes a gate structure, disposed on a substrate. A drain doped region of a first conductive type is in the substrate, adjacent to a first side of the gate structure, wherein the drain doped region has a first impurity concentration. A first doped region of the first conductive type is disposed within the drain doped region and being at least distant from the gate structure by a distance. The first doped region has a second impurity concentration lower than the first impurity concentration.

22 Claims, 7 Drawing Sheets

ELECTROSTATIC DISCHARGE (ESD) PROTECTION DEVICE AND METHOD FABRICATING THE ESD PROTECTION DEVICE

BACKGROUND

1. Field of the Invention

The present invention generally relates to semiconductor fabrication, in particular, to an electrostatic discharge (ESD) protection device and the fabrication method.

2. Description of Related Art

ESD protection devices have been used in an integrated circuit to connect between input/output terminal and the system power source VDD/VSS, so to avoid the discharged current to flow into the internal circuit. In various situations, the electronic apparatus with the integrated circuit is operated at high voltage, which is for example in a range of 20V to 100V. The integrated circuit has also been developed for operation at high voltage. Then, the protection of circuit from the ESD current then needs more consideration in design.

The ESD protection device usually is a mechanism of silicon control rectifier (SCR), which would be triggered in conducting state when an ESD current enters the input/output terminal, which is also connected to the ESD protection device. Due to the conducting state of the ESD protection device, the ESD current would be led to the system power source, such as the ground voltage (VSS) without entering the internal circuit.

In other words, at least two factors are concerned to determine whether or not the ESD protection device is proper. One factor as concerned is the trigger voltage of the ESD. The trigger voltage should be low so to be activated first before the ESD current at I/O terminal flows into the internal circuit. Another factor as concerned is that the bearable current of the ESD protection device. The ESD protection device with larger bearable current can bear more ESD current.

The conventional ESD protection device is based on the structure of MOS transistor, which has a gate structure on a substrate and then a source doped region and a drain doped region are in the substrate at two sides of the gate structure. For the use as the ESD protection device, two doped wells with two different conductive types are further formed in the substrate under the source doped region and the drain doped region. In this structure of ESD protection device, the two factors as stated above are not in acceptable condition.

Further then, the ESD protection device in conventional design is modified by setting the drain doped region to be separate from the gate structure by a distance. Then, the bearable current of the ESD protection device may be improved but the trigger voltage is still high. This implies that the capability of the ESD protection device is limited.

The design of ESD protection device to reduce the trigger voltage, particularly to the high voltage ESD protection device as an example, is still under developing.

SUMMARY OF THE INVENTION

The invention is directed to ESD protection device, which can at least keep a low trigger voltage and a high bearable current.

In an embodiment, an electrostatic discharge protection device includes a gate structure, disposed on a substrate. A drain doped region of a first conductive type is in the substrate, adjacent to a first side of the gate structure, wherein the drain doped region has a first impurity concentration. A first doped region of the first conductive type is disposed within the drain doped region and being at least distant from the gate structure by a distance. The first doped region has a second impurity concentration lower than the first impurity concentration.

In an embodiment for the ESD protection device as stated above, the distance between the gate structure and the first doped region is in a range of 0.08 microns to 0.28 microns.

In an embodiment for the ESD protection device as stated above, the distance between the gate structure and the first doped region is in a range of 0.1 microns to 0.2 microns.

In an embodiment for the ESD protection device as stated above, the first doped region comprises an impurity of the first conductive type or a combination of impurities of two conductive types.

In an embodiment for the ESD protection device as stated above, further a first doped well of the first conductive type is formed in the substrate under the drain doped region and the first doped region.

In an embodiment for the ESD protection device as stated above, the second impurity concentration of the first doped region is higher than, equal to, or lower than a third impurity concentration of the first doped well.

In an embodiment for the ESD protection device as stated above, a portion of the first doped well serves as the first doped region.

In an embodiment for the ESD protection device as stated above, further a source doped region of the first conductive type is formed in the substrate, at a second side of the gate structure.

In an embodiment for the ESD protection device as stated above, further a second doped well of a second conductive type is formed in the substrate under the source doped region, wherein the first conductive type to opposite to the second conductive type.

In an embodiment for the ESD protection device as stated above, further a second doped region of the second conductive type is formed within the second doped well, wherein the second doped region is isolated from the source doped region by an isolation structure.

In an embodiment for the ESD protection device as stated above, the first doped well and the second doped well are in contact under the gate structure, or the first doped well and the second doped well have a separation under the gate structure.

In an embodiment, a method for fabricating an ESD protection device, comprises providing a substrate. Then, a gate structure is formed on the substrate. A drain doped region of a first conductive type is formed in the substrate, adjacent to a first side of the gate structure, wherein the drain doped region has a first impurity concentration. A first doped region of the first conductive type is formed within the drain doped region and being at least distant from the gate structure by a distance. The first doped region has a second impurity concentration lower than the first impurity concentration.

In an embodiment for the method to fabricate the ESD protection device as stated above, the distance between the gate structure and the first doped region is in a range of 0.08 microns to 0.28 microns.

In an embodiment for the method to fabricate the ESD protection device as stated above, the distance between the gate structure and the first doped region is in a range of 0.1 microns to 0.2 microns.

In an embodiment for the method to fabricate the ESD protection device as stated above, further a first doped well of the first conductive type is formed in the substrate under the drain doped region and the first doped region.

In an embodiment for the method to fabricate the ESD protection device as stated above, a portion of the first doped well serves as the first doped region.

In an embodiment for the method to fabricate the ESD protection device as stated above, the method further comprises doping an impurity of the second conductive type into the drain doped region to form the first doped region.

In an embodiment for the method to fabricate the ESD protection device as stated above, the method further comprises doping an impurity of the first conductive type into the drain doped region to form the first doped region wherein a doping concentration of the impurity of the first doped region is lower than a doping concentration of the impurity of the drain doped region.

In an embodiment for the method to fabricate the ESD protection device as stated above, the method further comprises forming a source doped region of the first conductive type in the substrate, at a second side of the gate structure.

In an embodiment for the method to fabricate the ESD protection device as stated above, the method further comprises forming a second doped well of a second conductive type in the substrate under the source doped region, wherein the first conductive type to opposite to the second conductive type.

In an embodiment for the method to fabricate the ESD protection device as stated above, the method further comprises forming a second doped region of the second conductive type within the second doped well, wherein the second doped region is isolated from the source doped region by an isolation structure.

In an embodiment for the method to fabricate the ESD protection device as stated above, the first doped well and the second doped well are in contact under the gate structure, or the first doped well and the second doped well have a separation under the gate structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Several embodiments are provided for describing the invention but the invention is not limited to the embodiments as provided. Further, any proper combination between the embodiments can be allowed to form another embodiment.

The invention has looked into the design of ESD protection device, and proposed an ESD protection device, which can keep low trigger voltage and high bearable current.

Figure 1:
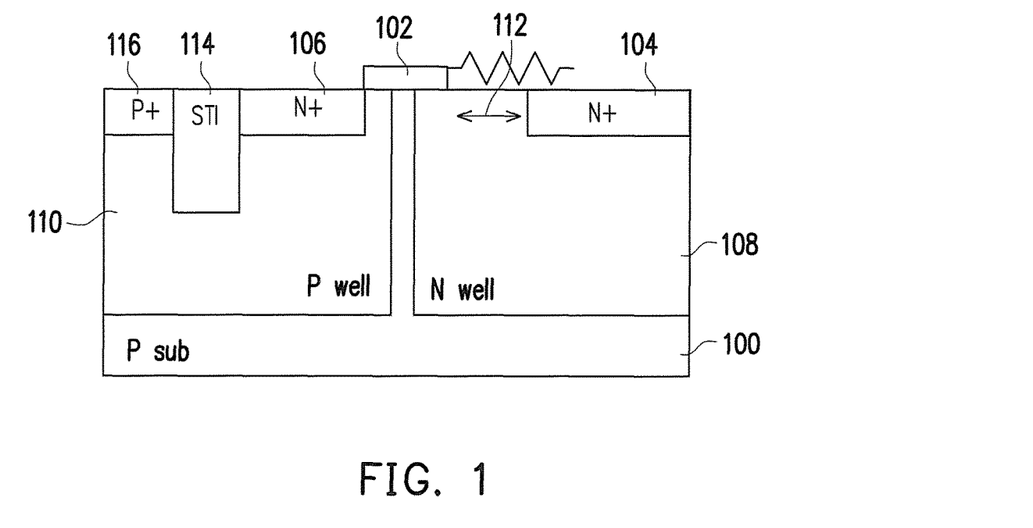
FIG. 1 is a drawing, schematically illustrating a cross-sectional structure of an ESD protection device, according to an embodiment of the invention.

Before describing the ESD protection device as proposed in the invention, the invention addresses some issues when looking into the ESD protection device. FIG. 1 is a drawing, schematically illustrating a cross-sectional structure of an ESD protection device, according to an embodiment of the invention.

Referring to FIG. 1, the invention has looked into an ESD protection device as concerned in the invention. To have the intended capability of the ESD protection device, the ESD protection devices is based on the structure of MOS transistor, including a substrate 100, such as P-type substrate (P sub). A gate structure 102 is formed on the substrate 100. A drain doped region 104 is formed in the substrate 100 at one side of the gate structure 102. Here, the drain doped region 104 is distant from the gate structure 102 by a distance 112. In addition, a source doped region 106 is formed in the substrate 100 at another side of the gate structure 102. In the example, the drain doped region 104 and the source doped region 106 are doped with impurities of a first conductive type, such as N conductive type. The drain doped region 104 and the source doped region 106 usually have a relatively high impurity concentration, and are usually indicated by N+ for the NMOS device.

For the capability of ESD protection device, a first doped well 108 of the first conductive type, such as N conductive type in the embodiment as also indicated by "N well", is formed in the substrate 100 under the drain doped region 104. The first doped well 108 also extends to the gate structure 102. In addition, a second doped well 110 of a second conductive type, such as P conductive type in the embodiment as also indicated by "P well", is formed in the substrate 100 under the source doped region 106. The second doped well 110 also extends to the gate structure 102. In an embodiment, the first doped well 108 and the second doped well 110 have a separation under the gate structure 102. However, in another embodiment, the first doped well 108 and the second doped well 110 may contact under the gate structure 102.

Further, a doped region 116, such as P+ doped region, is also formed in the substrate 100 within the second doped well (P well) 110, but is isolated from the source doped region 106 by an isolation structure 114, such as shallow trench isolation (STI) structure.

For the preliminary structure of the ESD protection device as shown in FIG. 1, the distance 112 between the gate structure 102 and the drain doped region 104 can serve as a parasitic resistor in the circuit. As a result for the ESD protection device in FIG. 1, the bearable current of the ESD protection device can be improved by a level when comparing with the situation having no the distance 112. However, the trigger voltage of the ESD protection device may be increasing, not reducing as expected.

The invention then further looks into the ESD protection device shown in FIG. 1 and proposes the further modification on the ESD protection device to improve the ESD protection capability.

Figure 2:
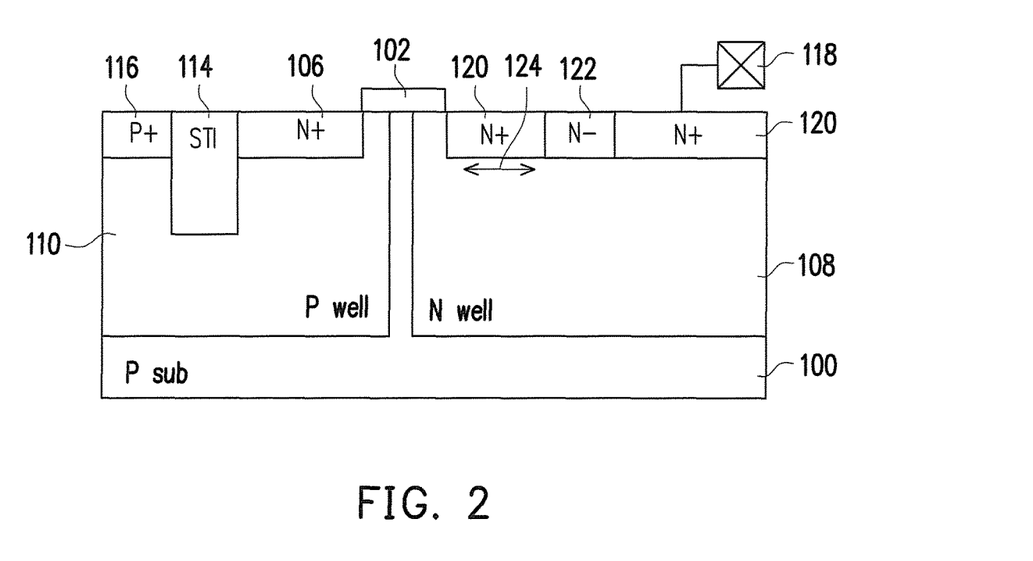
FIG. 2 is a drawing, schematically illustrating a cross-sectional structure of an ESD protection device, according to an embodiment of the invention.
Figure 3:
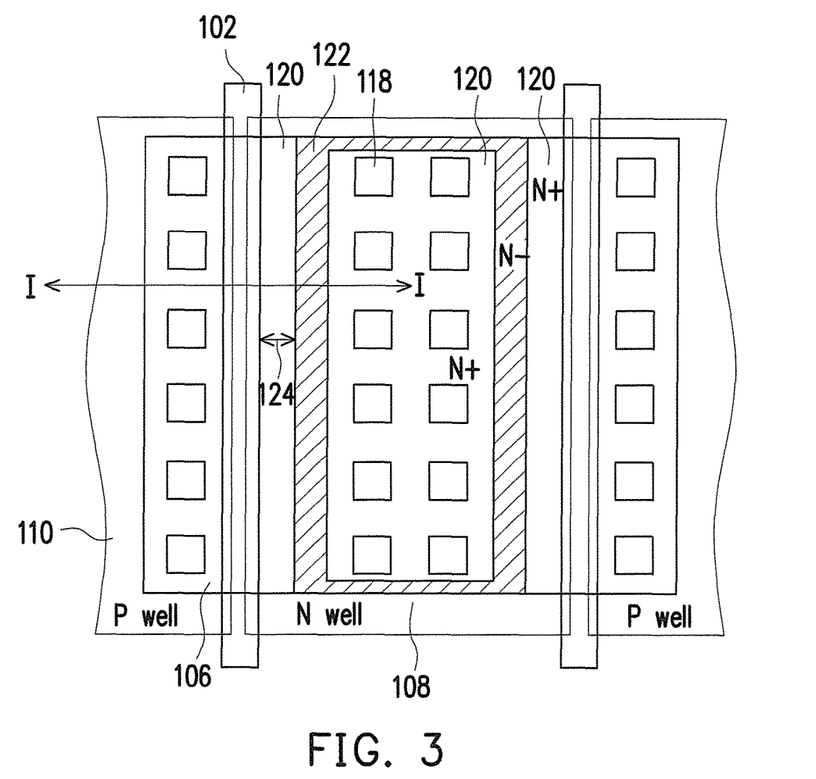
FIG. 3 is a drawing, schematically illustrating a top view of an ESD protection device, according to an embodiment of the invention.

FIG. 2 is a drawing, schematically illustrating a cross-sectional structure of an ESD protection device, according to an embodiment of the invention. FIG. 3 is a drawing, schematically illustrating a top view of an ESD protection device, according to an embodiment of the invention. Please note that the cross-sectional structure in FIG. 2 is along the cutting line I-I in FIG. 3 with better detail structure. The drawings are just schematically showing the features.

Referring to FIG. 2 and FIG. 3, the ESD protection device with further modification on the structure in FIG. 1 is proposed. Generally, the gate structure 102 is disposed on the substrate 100. A drain doped region 120 of the first conductive type is formed in the substrate 100, adjacent to a first side of the gate structure 102. The drain doped region 120 has a first impurity concentration with relatively high level, such as N+ as indicated. A first doped region 122 of the first conductive type is disposed within the drain doped region 120. The first doped region 122 is at least distant from the gate structure 102 by a distance 124. Here, the first doped region 122 (N−) has a second impurity concentration. It can be noted that the second impurity concentration of the first doped region 122 (N−) is lower than the first impurity concentration (N+), but remains the N conductive type. To easily understanding, the first doped region 122 is indicated by N−, which implies the same conductive type as the drain doped region 120 but lower impurity concentration. The region at the distance 124 between the first doped region 122 and the gate structure 102 is still a part of the drain doped region 120 with the relatively-high impurity concentration (N+). In addition, the connection pads 118 are also formed on the drain doped region 120 for connecting to the electrode, such as anode.

As also stated in FIG. 1, the source doped region 106 is formed in the substrate 100 at a second side of the gate structure 102. In the example, the drain doped region 104 and the source doped region 106 are doped with impurities of a first conductive type, such as N conductive type. The drain doped region 104 and the source doped region 106 usually have a relatively high impurity concentration, and are usually indicated by N+ for the NMOS device.

For the capability of ESD protection device, a first doped well 108 of the first conductive type, such as N conductive type in the embodiment as also indicated by "N well", is formed in the substrate 100 under the drain doped region 104. The first doped well 108 also extends to the gate structure 102. In addition, a second doped well 110 of a second conductive type, such as P conductive type in the embodiment as also indicated by "P well", is formed in the substrate 100 under the source doped region 106. The second doped well 110 also extends to the gate structure 102. In an embodiment, the first doped well 108 and the second doped well 110 have a separation under the gate structure 102. However, in another embodiment, the first doped well 108 and the second doped well 110 may contact under the gate structure 102, as shown later in FIG. 7.

In addition, as shown in FIG. 2 not in FIG. 3, a doped region 116 such as P+ doped region is also formed in the substrate 100 within the second doped well (P well) 110, but is isolated from the source doped region 106 by an isolation structure 114, such as shallow trench isolation (STI) structure.

Figure 4:
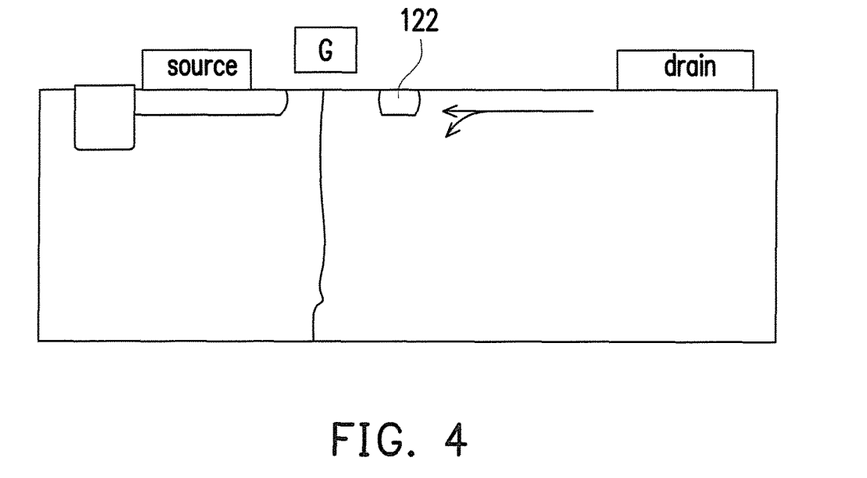
FIG. 4 is a drawing, schematically illustrating a current shunt mechanism of an ESD protection device, according to an embodiment of the invention.

The structure of ESD protection device as shown in FIGS. 2 and 3 has introduced the first doped region 122 as the lightly dope region (N−), which is inserted in the usual drain doped region 120 with distance 124 from the gate structure 102. As a result, the first doped region 122 can produce the phenomenon of current shunt and cause the ESD current to be more evenly flowing through the gate structure. The invention has looked into the effect of the first doped region 122. FIG. 4 is a drawing, schematically illustrating a current shunt mechanism of an ESD protection device, according to an embodiment of the invention. Referring to FIG. 4, the phenomenon of current shunt as indicated by the arrows has been observed due to the first doped region 122. The ESD protection device then can have low trigger voltage and high bearable current.

In order to create the first doped region 122, various manners can be done as to be described layer. Here, one of the examples to form the first doped region 122 by doping P-type impurity to reduce the impurity concentration (N+) of the drain doped region 120 as to be described later in FIG. 6.

Figure 6:
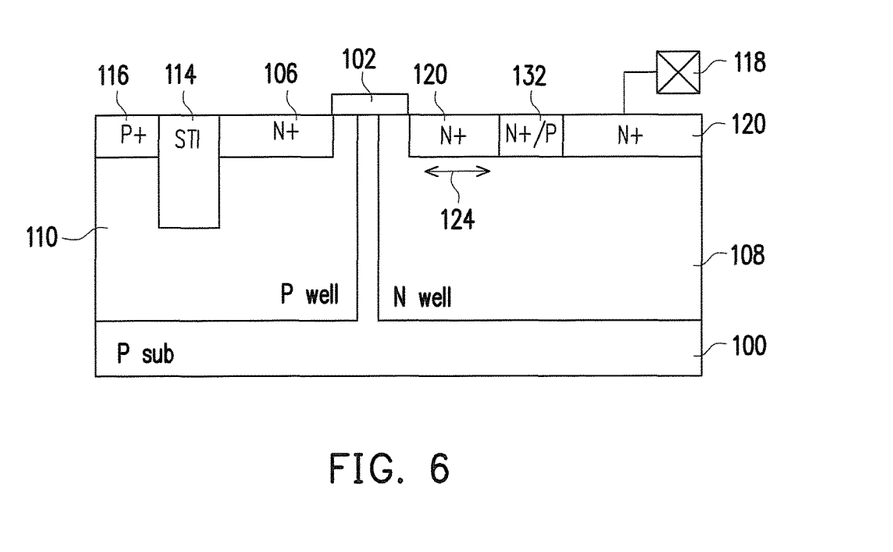
FIG. 6 is a drawing, schematically illustrating a cross-sectional structure of an ESD protection device, according to an embodiment of the invention.

However, before describing the propose ESD protection device in FIG. 6, the invention wants to address a feature that the first doped region 122 should keep the same conductivity type as the drain doped region 120. If the P-type impurities are over applied to the first doped region 122 and cause the first doped region 122 to change into the P conductive type. It would cause an issue of latch-up form the ESD protection device.

Figure 5:
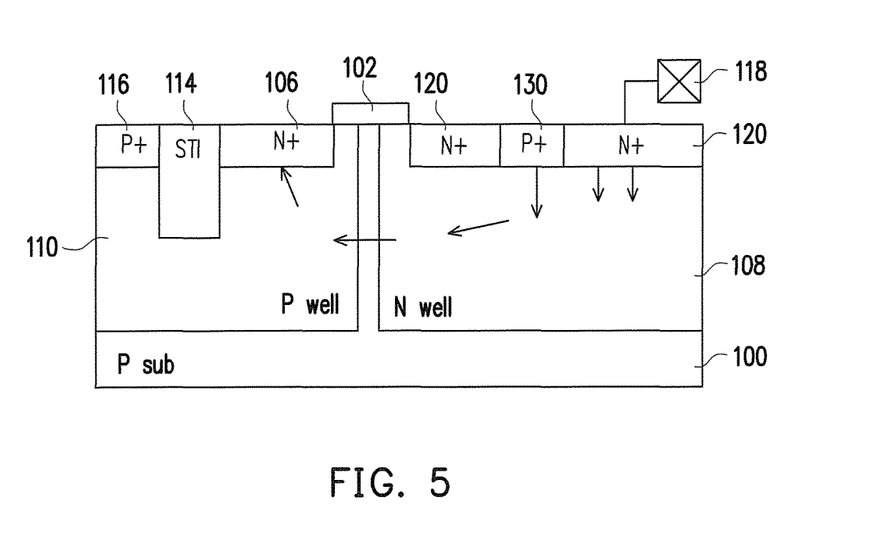
FIG. 5 is a drawing, schematically illustrating a cross-sectional structure of an ESD protection device, according to an embodiment of the invention, according to an embodiment of the invention.

FIG. 5 is a drawing, schematically illustrating a cross-sectional structure of an ESD protection device, according to an embodiment of the invention, according to an embodiment of the invention. Referring to FIG. 5 in this example, the P-type impurities are over applied to the first doped region 122 and cause the first doped region 122 to change into the P-type dopes region 130 (P+). In this ESD protection device as shown in FIG. 5 may create the PNPN SCR (silicon controlled rectifier) path as indicated by the arrows. As a result, although the ESD protection device becomes more sensitive, it may cause a latch up in the circuit.

The invention has looked into the issue in FIG. 5 and proposed the ESD protection device for reducing the possibility of latch up. FIG. 6 is a drawing, schematically illustrating a cross-sectional structure of an ESD protection device, according to an embodiment of the invention. Referring to FIG. 6, the ESD protection device in FIG. 6 is similar to the ESD protection device in FIG. 2 but the first doped region 122 formed according to an embodiment by doping P-type impurity. The descriptions here are relating to the first doped region 132. The other parts of the structure can be referred to FIG. 2.

In fabrication procedure, after the drain doped region 120 is formed, a certain level of P-type impurities are further doped into the drain doped region 120. Due to the compensation from the P-type impurities at the first doped region 132, the impurity concentration of N-type impurity for the drain doped region 120 at the first doped region 132 is reduced, as indicated by "N+/P". It should be noted that the N conductive type still remains at the first doped region 132, but the N-type impurity concentration at the first doped region 132 is reduced as described in FIG. 2 in which "N−" is used to indicate the impurity concentration.

Figure 7:
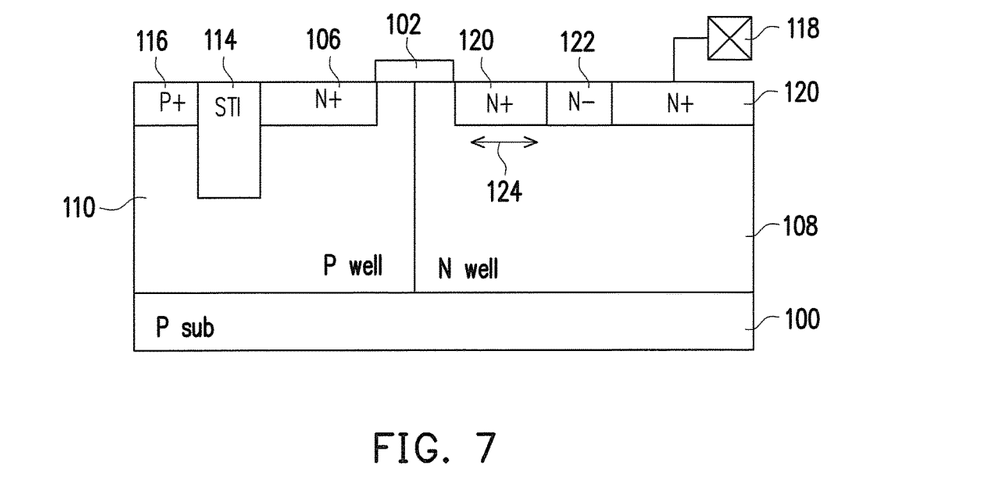
FIG. 7 is a drawing, schematically illustrating a cross-sectional structure of an ESD protection device, according to an embodiment of the invention.

Further modifications to FIG. 2 are to be described in the following descriptions. FIG. 7 is a drawing, schematically illustrating a cross-sectional structure of an ESD protection device, according to an embodiment of the invention. Referring to FIG. 7, the structure of the ESD protection device as shown in FIG. 7 as another embodiment is similar to the structure of the ESD protection device as shown in FIG. 2. The modification in the embodiment of FIG. 7 is the first doped well 108 and the second doped well 110, which are contact to each other under the gate structure 102. However, the first doped region 122 is still separate from the gate structure 102 by the distance 124. The first doped region 122 can produce the effect of current shunt to improve the performance of the ESD protection device.

Figure 8:
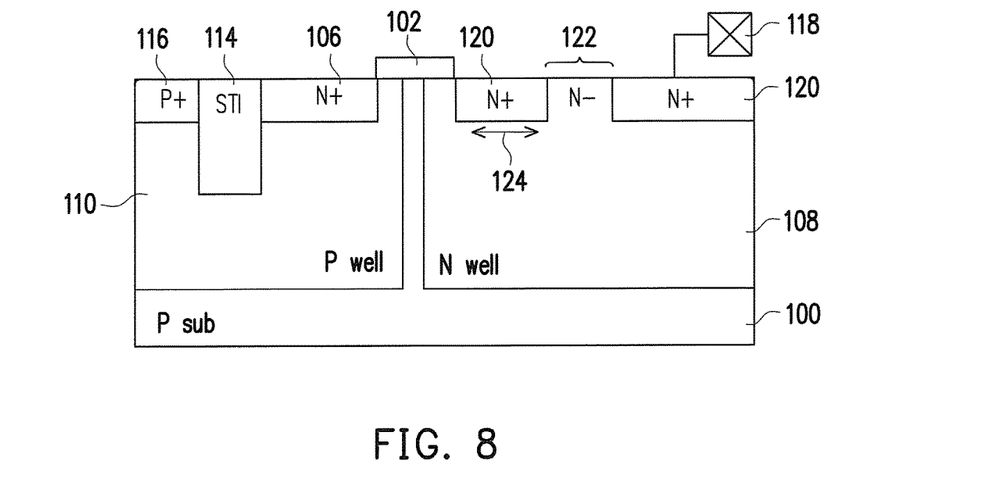
FIG. 8 is a drawing, schematically illustrating a cross-sectional structure of an ESD protection device, according to an embodiment of the invention.

In further modifications, FIG. 8 is a drawing, schematically illustrating a cross-sectional structure of an ESD protection device, according to an embodiment of the invention. Referring to FIG. 8, as to the first doped region 122, the impurity concentration of the first doped region 122 is lower thane the impurity concentration of the drain doped region 120. However, the impurity concentration of the first doped region 122 can be higher than, equal to, or lower than the impurity concentration of the first doped well (N well) 108. In this embodiment of FIG. 8, a part of the first doped well (N well) 108 can serve as the first doped region 122 in which the impurity concentration of the first doped well (N well) 108 is lower than the impurity concentration of the drain doped region 120 but equal to the impurity concentration of the first doped well 108. In doping procedure, the drain doped region 120 with the reserved region for the first doped region 122 is formed in the first doped well 108.

Figure 9:
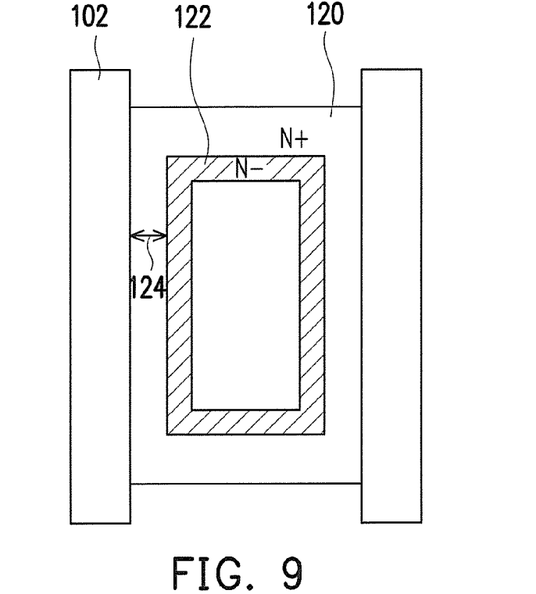
FIG. 9 is a drawing, schematically illustrating a top view of an ESD protection device, according to an embodiment of the invention.

FIG. 9 is a drawing, schematically illustrating a top view of an ESD protection device, according to an embodiment of the invention. The further modification to the structure of the ESD protection device in FIG. 2 and FIG. 3 can be the layout of the first doped region 122. In the embodiment, the side of the first doped region 122 along the gate structure 102 may be just at the central region, not necessarily extending to full length of the drain doped region 120. In other words, the first doped region 122 is distant from the gate structure by the distance 124 but the geometric shape of the first doped region 122 can vary according to the actual designs.

Figure 10:
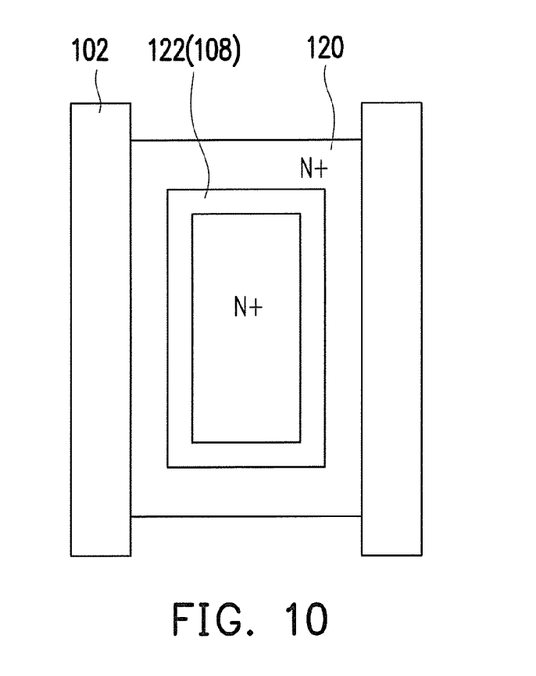
FIG. 10 is a drawing, schematically illustrating a top view of an ESD protection device, according to an embodiment of the invention.

In further modifications, FIG. 10 is a drawing, schematically illustrating a top view of an ESD protection device, according to an embodiment of the invention. Referring to FIG. 10, the embodiment is a combination of FIG. 8 and FIG. 9. In the embodiment of FIG. 10, the first doped region 122 is just a part of the first doped well (N well) 108.

Figure 11:
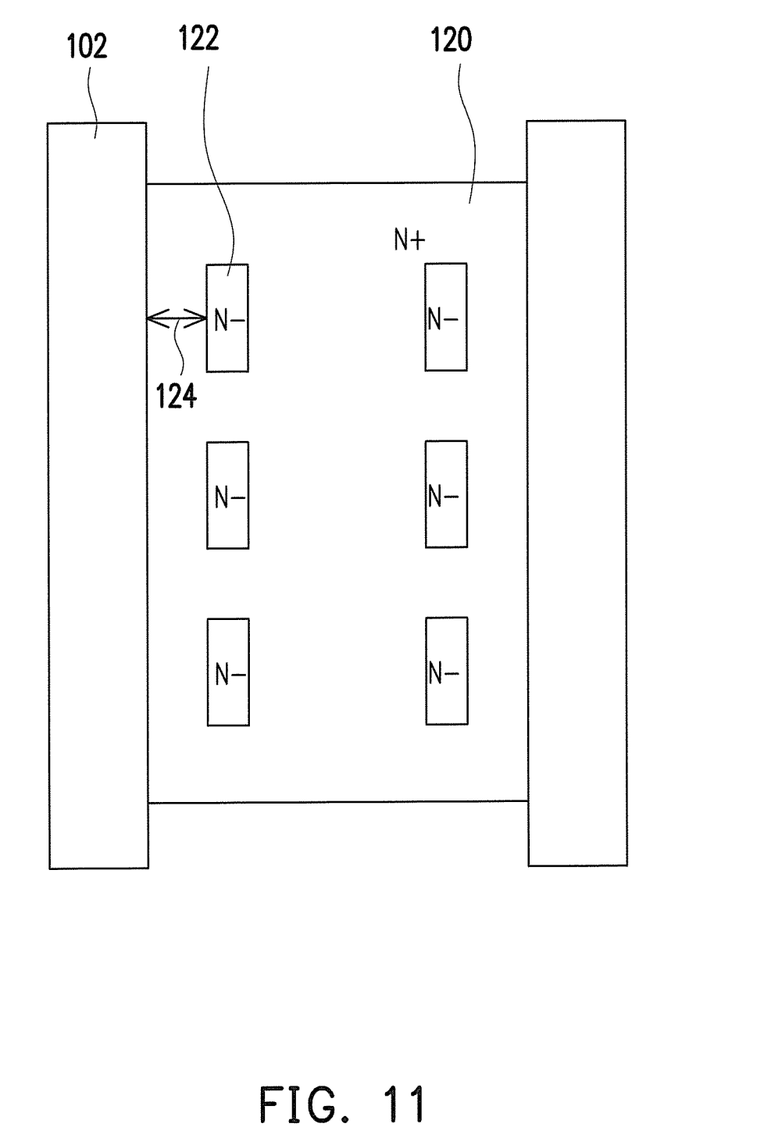
FIG. 11 is a drawing, schematically illustrating a top view of an ESD protection device, according to an embodiment of the invention.

In further modifications, FIG. 11 is a drawing, schematically illustrating a top view of an ESD protection device, according to an embodiment of the invention. Referring to FIG. 11, the first doped region 122 may be formed from a plurality of small doped regions, distributed in the drain doped region 120. However, the feature of the distance 124 between the gate structure 102 and the first doped region 122 still remains.

Remarkably, several embodiments are provided above for describing the invention but the invention is not just limited to the embodiment. A proper combination between the embodiments may also be made to have the further embodiments.

Further, the ESD protection device in the embodiment is based on N-type MOS structure. However, the invention can be applied to the P-type MOS structure by changing the impurities in opposite conductive type. In other words, the N-type doped regions and the P-type doped regions of the ESD protection device can be interchanged.

Figure 12:
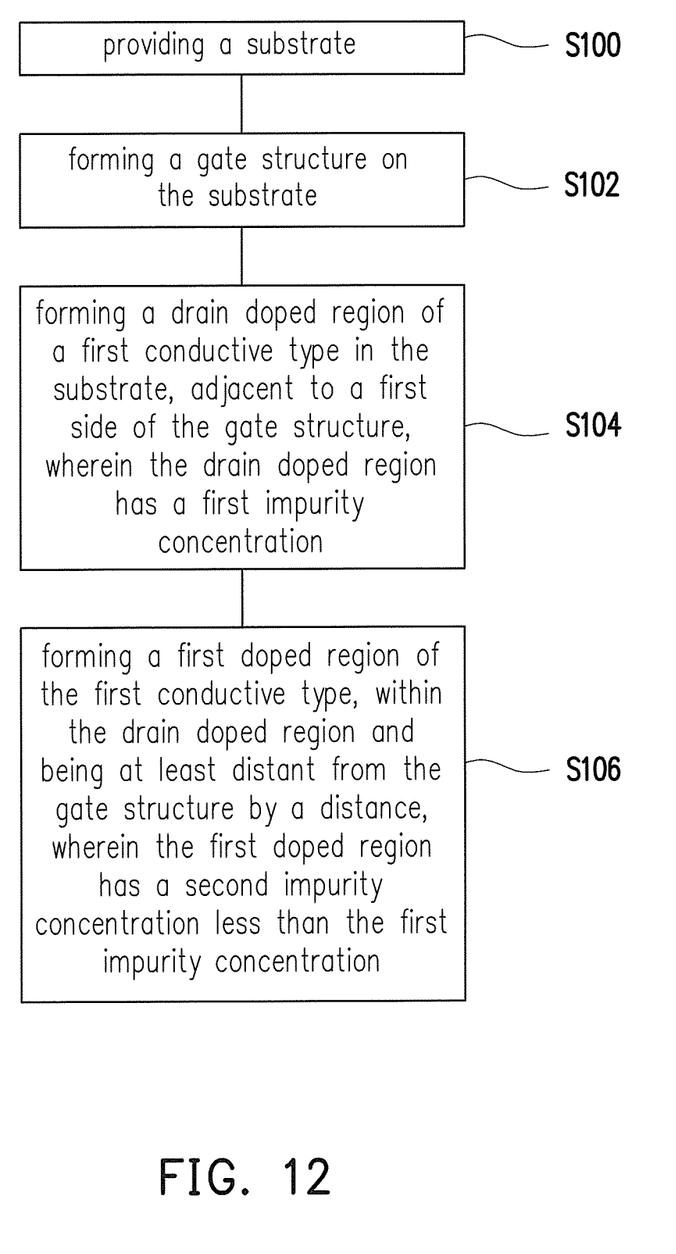
FIG. 12 is a drawing, schematically illustrating a method for fabricating ESD protection device, according to an embodiment of the invention.

Even further as to the fabrication method, FIG. 12 is a drawing, schematically illustrating a method for fabricating ESD protection device, according to an embodiment of the invention. Referring to FIG. 12, in step S100, the method includes providing a substrate. In step S102, the method also includes forming a gate structure on the substrate. In step S104, the method also includes forming a drain doped region of a first conductive type in the substrate, adjacent to a first side of the gate structure, wherein the drain doped region has a first impurity concentration. In step S106, the method also includes forming a first doped region of the first conductive type, within the drain doped region and being at least distant from the gate structure by a distance. The first doped region has a second impurity concentration lower than the first impurity concentration.

In another embodiment of the method for fabricating the ESD protection device, the distance between the gate structure and the first doped region is in a range of 0.08 microns to 0.28 microns, or in a range of 0.1 microns to 0.2 microns.

In another embodiment of the method for fabricating the ESD protection device, the method further includes forming a first doped well of the first conductive type in the substrate under the drain doped region and the first doped region.

In another embodiment of the method for fabricating the ESD protection device, a portion of the first doped well serves as the first doped region.

In another embodiment of the method for fabricating the ESD protection device, the method further includes doping an impurity of the second conductive type into the drain doped region to form the first doped region.

In another embodiment of the method for fabricating the ESD protection device, the method further includes doping an impurity of the first conductive type into the drain doped region to form the first doped region wherein a doping concentration of the impurity of the first doped region is lower than a doping concentration of the impurity of the drain doped region.

In another embodiment of the method for fabricating the ESD protection device, the method further includes forming a source doped region of the first conductive type in the substrate, at a second side of the gate structure.

In another embodiment of the method for fabricating the ESD protection device, the method further includes forming a second doped well of a second conductive type in the substrate under the source doped region, wherein the first conductive type to opposite to the second conductive type.

In another embodiment of the method for fabricating the ESD protection device, the method further includes forming a second doped region of the second conductive type within the second doped well, wherein the second doped region is isolated from the source doped region by an isolation structure.

In another embodiment of the method for fabricating the ESD protection device, the first doped well and the second doped well are in contact under the gate structure, or the first doped well and the second doped well have a separation under the gate structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) device, comprising:
    a gate structure, disposed on a substrate;
    a drain doped region of a first conductive type in the substrate, adjacent to a first side of the gate structure, wherein the drain doped region has a first impurity concentration; and
    a first doped region of the first conductive type, disposed within the drain doped region and being at least distant from the gate structure by a distance, wherein the first doped region has a second impurity concentration lower than the first impurity concentration.

2. The ESD protection device of claim 1, wherein the distance between the gate structure and the first doped region is in a range of 0.08 microns to 0.28 microns.

3. The ESD protection device of claim 1, wherein the distance between the gate structure and the first doped region is in a range of 0.1 microns to 0.2 microns.

4. The ESD protection device of claim 1, wherein the first doped region comprises an impurity of the first conductive type or a combination of impurities of two conductive types.

5. The ESD protection device of claim 1, further comprising a first doped well of the first conductive type in the substrate under the drain doped region and the first doped region.

6. The ESD protection device of claim 5, wherein the second impurity concentration of the first doped region is higher than, equal to, or lower than a third impurity concentration of the first doped well.

7. The ESD protection device of claim 5, wherein a portion of the first doped well serves as the first doped region.

8. The ESD protection device of claim 1, further comprising a source doped region of the first conductive type in the substrate, at a second side of the gate structure.

9. The ESD protection device of claim 8, further comprising a second doped well of a second conductive type in the substrate under the source doped region, wherein the first conductive type to opposite to the second conductive type.

10. The ESD protection device of claim 9, further comprising a second doped region of the second conductive type within the second doped well, wherein the second doped region is isolated from the source doped region by an isolation structure.

11. The ESD protection device of claim 9, wherein the first doped well and the second doped well are in contact under the gate structure, or the first doped well and the second doped well have a separation under the gate structure.

12. A method for fabricating an electrostatic discharge (ESD) device, comprising:
    providing a substrate;
    forming a gate structure on the substrate;
    forming a drain doped region of a first conductive type in the substrate, adjacent to a first side of the gate structure, wherein the drain doped region has a first impurity concentration; and
    forming a first doped region of the first conductive type, within the drain doped region and being at least distant from the gate structure by a distance, wherein the first doped region has a second impurity concentration lower than the first impurity concentration.

13. The method for fabricating the ESD protection device of claim 12, wherein the distance between the gate structure and the first doped region is in a range of 0.08 microns to 0.28 microns.

14. The method for fabricating the ESD protection device of claim 12, wherein the distance between the gate structure and the first doped region is in a range of 0.1 microns to 0.2 microns.

15. The method for fabricating the ESD protection device of claim 12, further comprising forming a first doped well of the first conductive type in the substrate under the drain doped region and the first doped region.

16. The method for fabricating the ESD protection device of claim 15, wherein a portion of the first doped well serves as the first doped region.

17. The method for fabricating the ESD protection device of claim 12, further comprising doping an impurity of the second conductive type into the drain doped region to form the first doped region.

18. The method for fabricating the ESD protection device of claim 12, further comprising doping an impurity of the first conductive type into the drain doped region to form the first doped region wherein a doping concentration of the impurity of the first doped region is lower than a doping concentration of the impurity of the drain doped region.

19. The method for fabricating the ESD protection device of claim 12, further comprising forming a source doped region of the first conductive type in the substrate, at a second side of the gate structure.

20. The method for fabricating the ESD protection device of claim 19, further comprising forming a second doped well of a second conductive type in the substrate under the source doped region, wherein the first conductive type to opposite to the second conductive type.

21. The method for fabricating the ESD protection device of claim 20, further comprising forming a second doped region of the second conductive type within the second doped well, wherein the second doped region is isolated from the source doped region by an isolation structure.

22. The method for fabricating the ESD protection device of claim 20, wherein the first doped well and the second doped well are in contact under the gate structure, or the first doped well and the second doped well have a separation under the gate structure.

* * * * *